US012581960B2

(12) United States Patent
Zhou et al.

(10) Patent No.: US 12,581,960 B2
(45) Date of Patent: Mar. 17, 2026

(54) HIGHLY INTEGRATED POWER ELECTRONICS AND METHODS OF MANUFACTURING THE SAME

(71) Applicant: Toyota Motor Engineering & Manufacturing North America, Inc., Plano, TX (US)

(72) Inventors: Feng Zhou, Ann Arbor, MI (US); Tianzhu Fan, Houston, TX (US); Jae Seung Lee, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 303 days.

(21) Appl. No.: 18/127,717

(22) Filed: Mar. 29, 2023

(65) Prior Publication Data

US 2024/0332204 A1 Oct. 3, 2024

(51) Int. Cl.
| | |
|---|---|
| *H01L 21/56* | (2006.01) |
| *H01L 23/00* | (2006.01) |
| *H01L 23/31* | (2006.01) |
| *H01L 23/498* | (2006.01) |
| *H01L 23/544* | (2006.01) |

(52) U.S. Cl.
CPC .......... *H01L 23/544* (2013.01); *H01L 21/561* (2013.01); *H01L 23/3121* (2013.01); *H01L 23/49861* (2013.01); *H01L 24/19* (2013.01); *H01L 24/20* (2013.01); *H01L 24/95* (2013.01); *H01L 2223/54426* (2013.01); *H01L 2224/19* (2013.01); *H01L 2224/214* (2013.01); *H01L 2224/215* (2013.01); *H01L 2224/95* (2013.01); *H01L 2924/01029* (2013.01)

(58) Field of Classification Search
None
See application file for complete search history.

(56) References Cited

U.S. PATENT DOCUMENTS

| | | | |
|---|---|---|---|
| 5,521,427 A | 5/1996 | Chia et al. | |
| 6,048,744 A | 4/2000 | Corisis et al. | |
| 6,836,003 B2 | 12/2004 | Corisis et al. | |
| 6,917,219 B2 | 7/2005 | New | |
| 7,786,837 B2 | 8/2010 | Hébert | |

(Continued)

FOREIGN PATENT DOCUMENTS

CN 100596253 C 7/2008

*Primary Examiner* — Jay C Chang
(74) *Attorney, Agent, or Firm* — Christopher G. Darrow; Darrow Mustafa PC

(57) ABSTRACT

A method for manufacturing a power device fabrication panel includes aligning a first alignment mark in a lead frame of a power device substrate array with a second alignment mark in a bonding fixture. The power device substrate array includes a plurality of power device pockets, the bonding fixture includes a plurality of power device openings, and the power device openings are in assembly alignment with the power device pockets when the first alignment mark is aligned with the second alignment mark. And with the bonding fixture power device openings in assembly alignment with the power device pockets of the power device substrate array, a plurality of power devices are moved at least partially through the aligned power device openings and into the power device pockets where they are bonded.

20 Claims, 13 Drawing Sheets

(56) References Cited

U.S. PATENT DOCUMENTS

| | | |
|---|---|---|
| 2008/0160670 A1 | 7/2008 | Lam |
| 2011/0248410 A1 | 10/2011 | Avsian et al. |
| 2017/0110436 A1* | 4/2017 | Truhitte ............ H01L 21/31138 |
| 2018/0261535 A1* | 9/2018 | Lin ........................ H01L 23/544 |

* cited by examiner

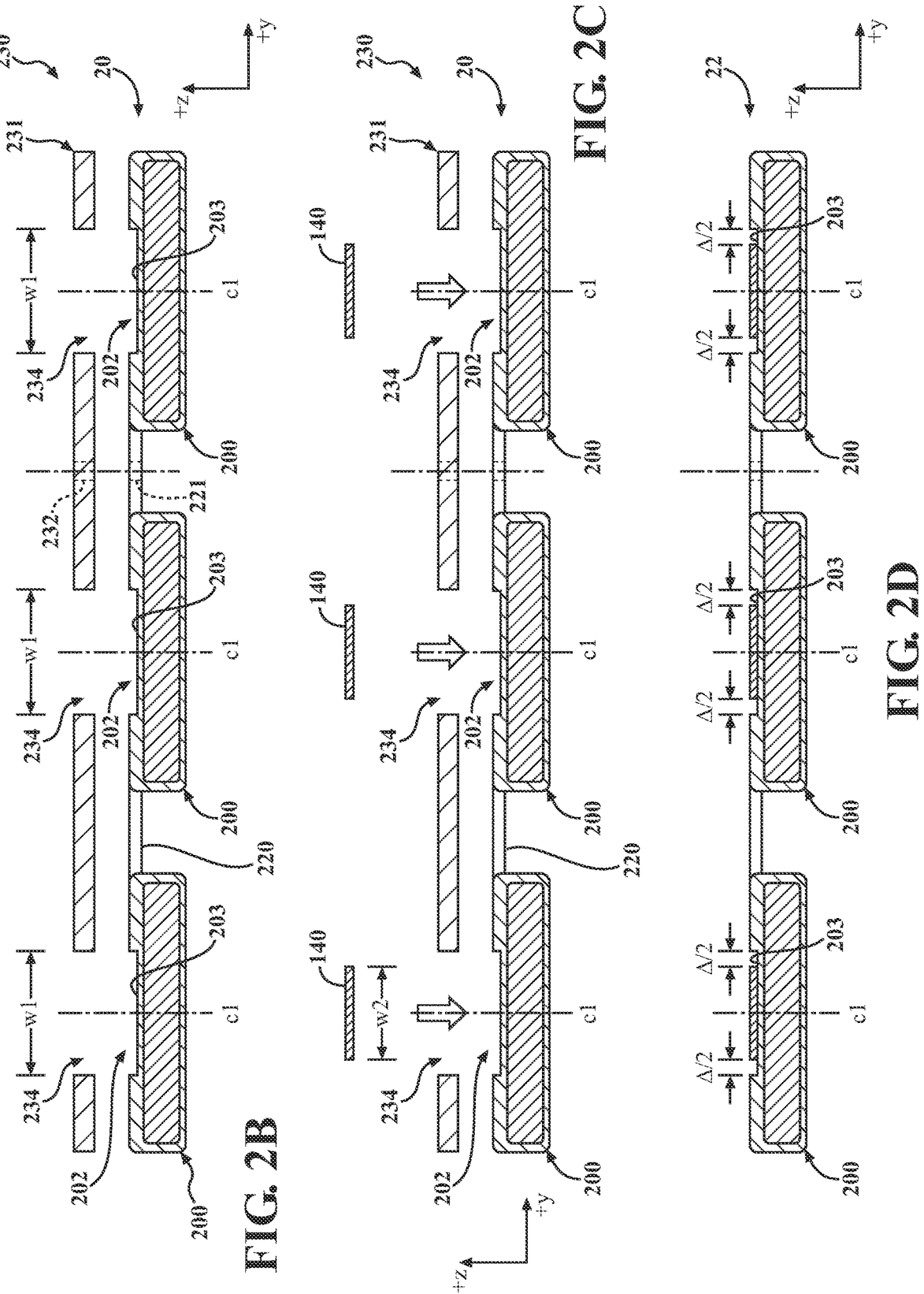

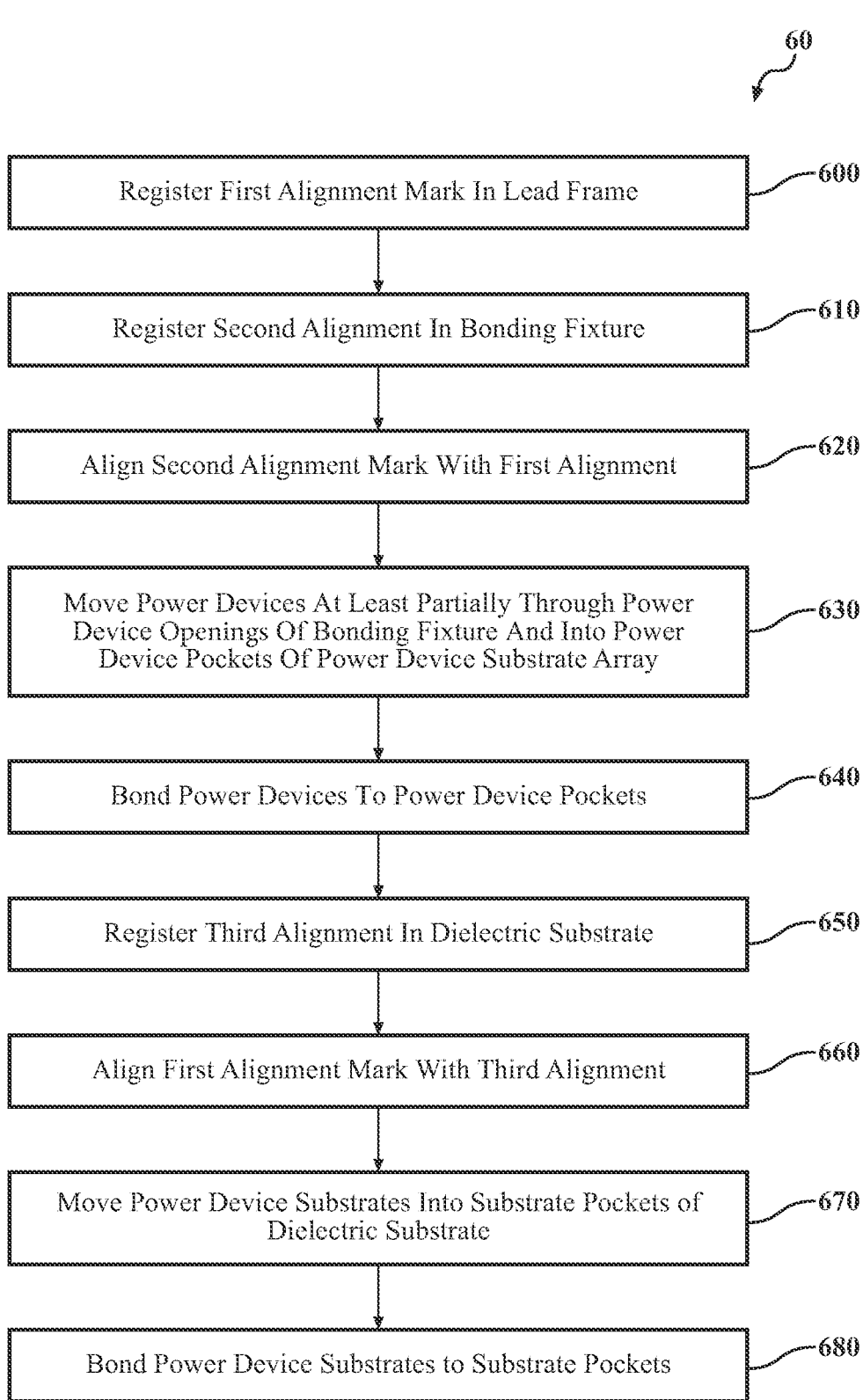

60

Register First Alignment Mark In Lead Frame — 600

↓

Register Second Alignment In Bonding Fixture — 610

↓

Align Second Alignment Mark With First Alignment — 620

↓

Move Power Devices At Least Partially Through Power Device Openings Of Bonding Fixture And Into Power Device Pockets Of Power Device Substrate Array — 630

↓

Bond Power Devices To Power Device Pockets — 640

↓

Register Third Alignment In Dielectric Substrate — 650

↓

Align First Alignment Mark With Third Alignment — 660

↓

Move Power Device Substrates Into Substrate Pockets of Dielectric Substrate — 670

↓

Bond Power Device Substrates to Substrate Pockets — 680

FIG. 6

HIGHLY INTEGRATED POWER ELECTRONICS AND METHODS OF MANUFACTURING THE SAME

TECHNICAL FIELD

The present disclosure relates to integrated power electronics, and particularly to printed circuit boards with power devices embedded therein.

BACKGROUND

Printed circuit boards (PCBs) are typically used for mechanical support and electrical connection of electronic components using conductive pathways of copper sheets laminated onto a non-conductive substrate. And multi-layer PCBs provide higher capacity and/or density of electronic components in a smaller footprint by incorporating two or more layers. However, the design and/or manufacture of multilayer PCBs can be difficult.

The present disclosure addresses issues related to the manufacture of multi-layer PCBs and other issues related to multi-layer PCBs.

SUMMARY

This section provides a general summary of the disclosure and is not a comprehensive disclosure of its full scope or all of its features.

In one form of the present disclosure, a method includes aligning a first alignment mark in a lead frame of a power device substrate array with a plurality of power device pockets with a second alignment mark in a bonding fixture with a plurality of power device openings such that the power device openings are in assembly alignment with the power device pockets, and then assembling a plurality of power devices onto the power device substrate array by moving the plurality of power devices at least partially through the aligned power device openings and into the power device pockets.

In another form of the present disclosure, a method includes registering a first alignment mark in a lead frame structure of a power device substrate array with a plurality of power device substrates with a plurality of power device pockets and registering a second alignment mark on a bonding fixture with a plurality of power device openings. The first alignment mark is an aperture extending through the lead frame and the second alignment mark is an aperture extending through the bonding fixture. The method also includes positioning the bonding fixture proximate to the power device substrate array and aligning the first alignment mark with the second alignment mark such that the plurality of power device openings in the bonding fixture are in assembly alignment with the plurality of power device pockets in the power device substrate array, and assembling a plurality of power devices onto the power device substrate array by moving the plurality of power devices at least partially through the aligned power device openings and into the power device pockets.

In still another form of the present disclosure, a method includes registering a first alignment mark in a lead frame structure of a power device substrate array with a plurality of power device substrate with a plurality of power device pockets, registering a second alignment mark on a bonding fixture with a plurality of power device openings, and positioning the bonding fixture proximate to the power device substrate array and aligning the first alignment mark with the second alignment mark such that the plurality of power device openings in the bonding fixture are in assembly alignment with the plurality of power device pockets in the power device substrate array. The method further includes assembling a plurality of power devices onto the power device substrate array by moving the plurality of power devices at least partially through the aligned power device openings and into the power device pockets, and bonding the power device substrate array into the power device pockets and forming a power device fabrication layer. In some variations, the first alignment mark comprising an aperture extending through the lead frame and the second alignment mark comprising an aperture extending through the bonding fixture.

Further areas of applicability and various methods of enhancing the above technology will become apparent from the description provided herein. The description and specific examples in this summary are intended for purposes of illustration only and are not intended to limit the scope of the present disclosure.

BRIEF DESCRIPTION OF THE DRAWINGS

The present teachings will become more fully understood from the detailed description and the accompanying drawings, wherein:

FIG. 2B shows a side-cross-sectional view of section 2B-2B in FIG. 2A with the bonding fixture aligned with the substrate array according to the teachings of the present disclosure;

FIG. 2C shows FIG. 2B with a plurality of power devices to be assembled with the substrate array;

FIG. 2D shows a power device-substrate assembly array formed from the plurality of power devices assembled with the substrate array in FIG. 2C according to the teachings of the present disclosure;

FIG. 6 shows a flow chart for a method of manufacturing a power device fabrication panel according to the teachings of the present disclosure.

Figure 1A:
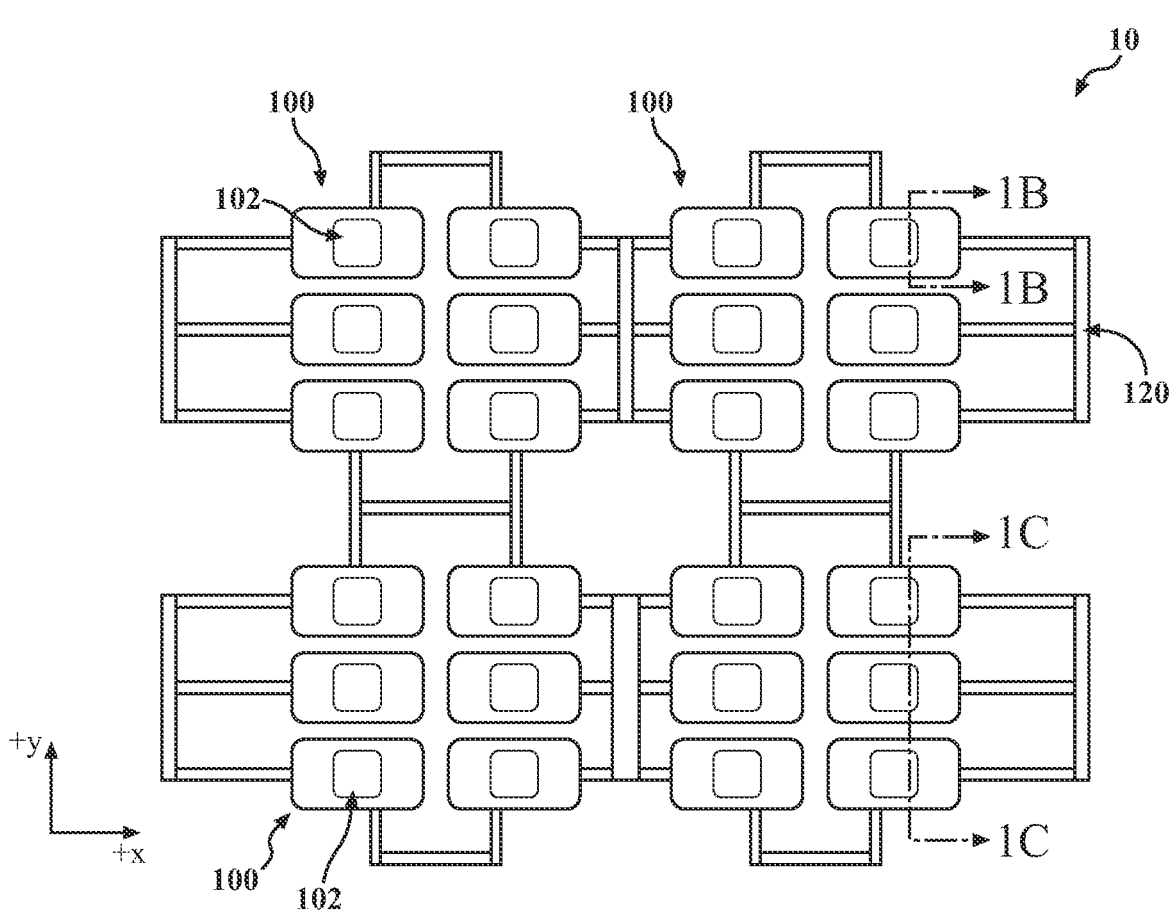
FIG. 1A shows a top view of an array of power device substrates (substrate array) with an array lead frame structure according to one form of the present disclosure.

It should be noted that the figures set forth herein are intended to exemplify the general characteristics of the methods, devices, and systems among those of the present technology, for the purpose of the description of certain aspects. The figures may not precisely reflect the characteristics of any given aspect and are not necessarily intended to define or limit specific forms or variations within the scope of this technology.

DETAILED DESCRIPTION

The present disclosure provides power device-substrate assembly arrays, power device fabrication panels, and methods for high volume manufacturing of power device-substrate assembly arrays, power device fabrication panels, and highly integrated power electronics (IPEs) embedded PCBs. As used herein, the phrase "power device-substrate assembly array" refers to an array of power devices assembled with an array of power device substrates (also referred to herein simply as "substrates") used for the assembly or manufacture of a power device fabrication panel. As used herein, the phrase "fabrication panel" refers to a panel containing a plurality highly IPEs embedded PCB components used for the manufacture of individual highly IPEs embedded PCBs. For example, a power device fabrication panel is a panel containing a plurality of power devices used for the manufacture of individual highly IPEs embedded PCBs. Also, the phrase "highly integrated power electronics embedded PCB" refers to a single multi-layer PCB module or unit with two or more power semiconductor devices (also referred to herein simply as "power device" or "power devices"), control/drive/protection electronic circuitry, and passive components, embedded therein. And as used herein, the phrase "power device" refers to a semiconductor device used as a switch or rectifier in power electronics, and a single multi-layer PCB module or unit with two or more power semiconductor devices embedded at least partially therein is referred to herein as an "integrated power electronics embedded PCB."

The methods of high volume manufacturing highly power device-substrate assembly arrays include registering one or more alignment marks in a substrate array and a bonding fixture such that a plurality of power devices can be and are desirably positioned and bonded to the substrate array to form a power device-substrate assembly array, And the methods of high volume manufacturing power device fabrication panels further includes registering one or more marks in a dielectric panel such that the power device-substrate array is desirably positioned and bonded to the dielectric panel. As used herein, the phrase "desirably positioned" refers to positioning a first component relative to a second component using one or more alignment marks as disclosed herein such that the first component is positioned relative to the second component with less variation compared to positioning the first component relative to the second component without using one or more alignment marks as disclosed herein.

Figure 1B:
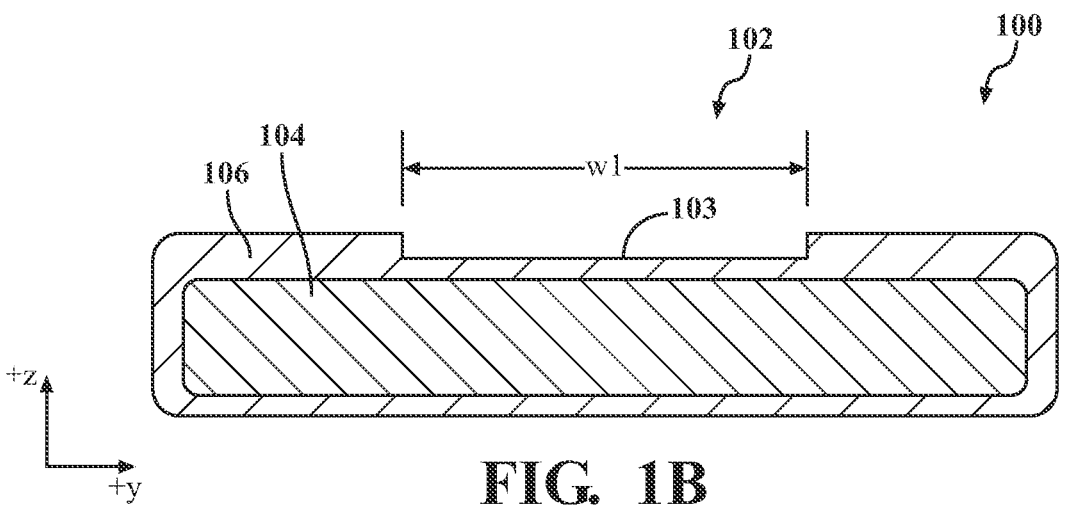
FIG. 1B shows a side cross-sectional view of section 1B-1B in FIG. 1A.

Referring to FIGS. 1A-1F, steps for manufacturing a power device fabrication panel according to one form of the present disclosure are shown. Referring particularly to FIG. 1A, a top view of a power device substrate array 10 (also referred to herein simply as "substrate array") is shown. The substrate array 10 includes an array of power device substrates 100 (also referred to herein simply as "substrate" or "substrates") and a lead frame structure 120 (also referred to herein simply as "lead frame"). As used herein, the term "substrate" and the phrase "power device substrate" refer to a substrate for a power device (e.g., a MOSFET power device) to be attached or bonded to. In some variations, the substrate 100 is a copper-graphite substrate 100 with a graphite core 104 embedded within a shell 106 of copper as illustrated in FIG. 1B. And in such variations, the substrate 100 can include a power device pocket 102 with a bonding or seating surface 103 where a power device is positioned and bonded to, e.g., via silver sintering. Also, as used herein the phrase "lead "frame" refers to a metal structure of a power device package that carries signals from the power device to other electronic components.

Figures 1C, 1D:
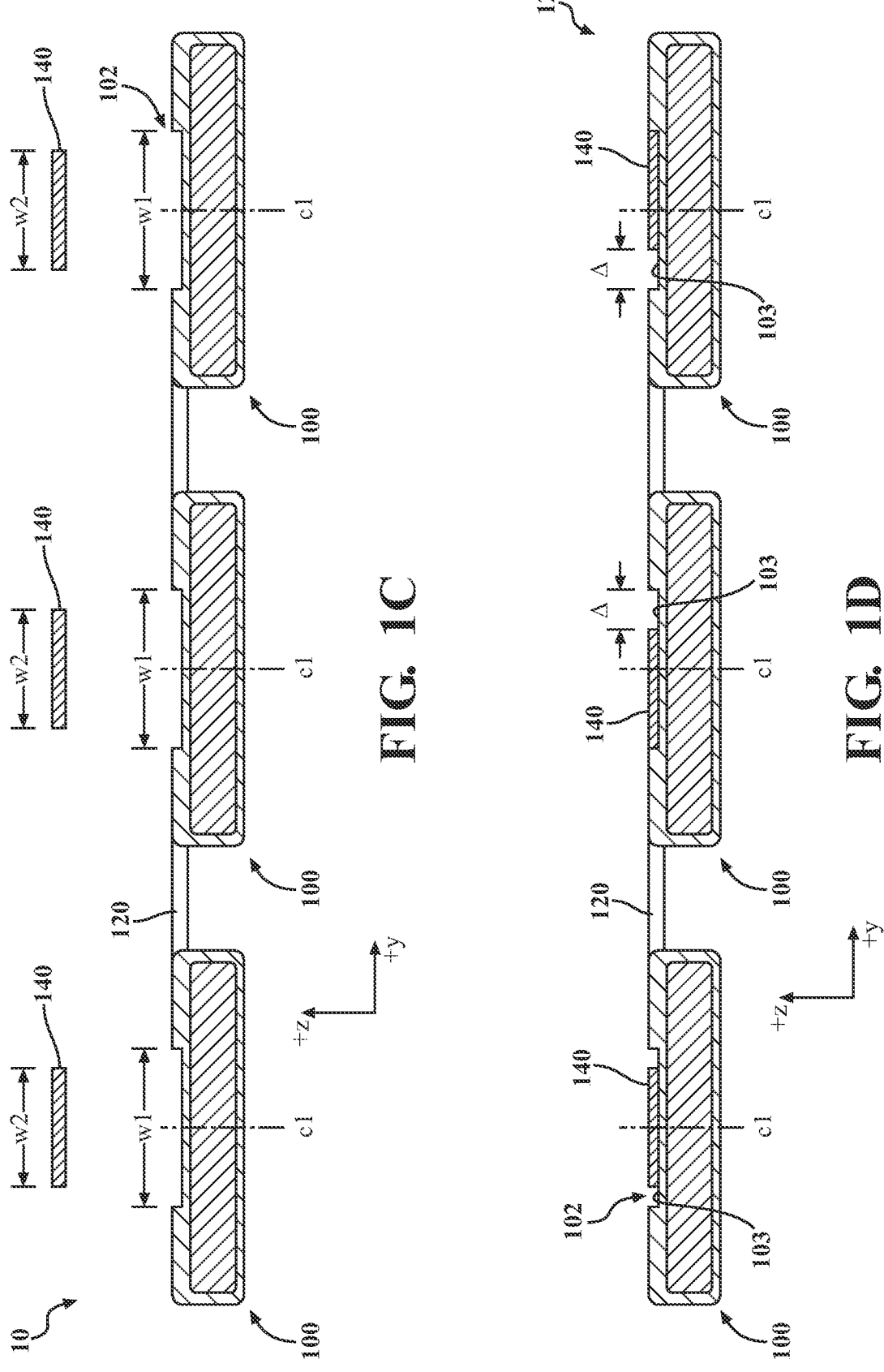
FIG. 1C shows a side cross-sectional view of section 1C-1C in FIG. 1A with a plurality of power devices to be assembled with the substrate array in FIG. 1A.
FIG. 1D shows a power device-substrate assembly array formed from the plurality of power devices in FIG. 1C assembled with the substrate array in FIG. 1A.

Referring to FIGS. 1C-1D, assembly of a power device-substrate fabrication layer 12 is shown. Particularly, a plurality of power devices 140 are assembled with and bonded to the seating surface 103 of the plurality of power device pockets 102 such that each power device pocket 102, and thus each power device substrate 100, has a power device 140 bonded thereto. The power devices pockets 102 have an interior dimension 'w1' (e.g., a width) and the power devices 140 have an exterior dimension 'w2' that is less than the interior dimension w1 such that a given power device 140 fits within a given power device pocket 102. That is, the power device pockets 102 have a gap or spacing of $\Delta = w1 - w2$ relative to the power devices 140. And as observed from FIG. 1D, placement of the power devices 140 within the power device pockets 102 can result in the power devices 140 being located and bonded at different positions within the power device pockets 102. For example, and assuming for discussion purposes that a desired position of the power devices 140 within the power device pockets 102 is centered along an axis 'c1' shown in FIGS. 1C-1D, the far left (−y direction) power device 140 is desirably located generally in the far left power device pocket 102, i.e., there is a distance or spacing of $\Delta/2$ between the power device 140 and both vertical (y-direction) sides of the power device pocket 102. However, the middle power device 140 is located "left of middle" (−y direction) in the middle power device pocket 102, and the far right (+y direction) power device 140 is located "right of middle" in the far right power device pocket 102. Accordingly, the distance or spacing between the middle power device 140 and the middle power device pocket 102 is Δ on the right hand side of the middle power device 140, while the distance or spacing between the far right power device 140 and the far right power device pocket 102 is Δ on the left hand side of the far right power device 140.

Figures 1E, 1F:
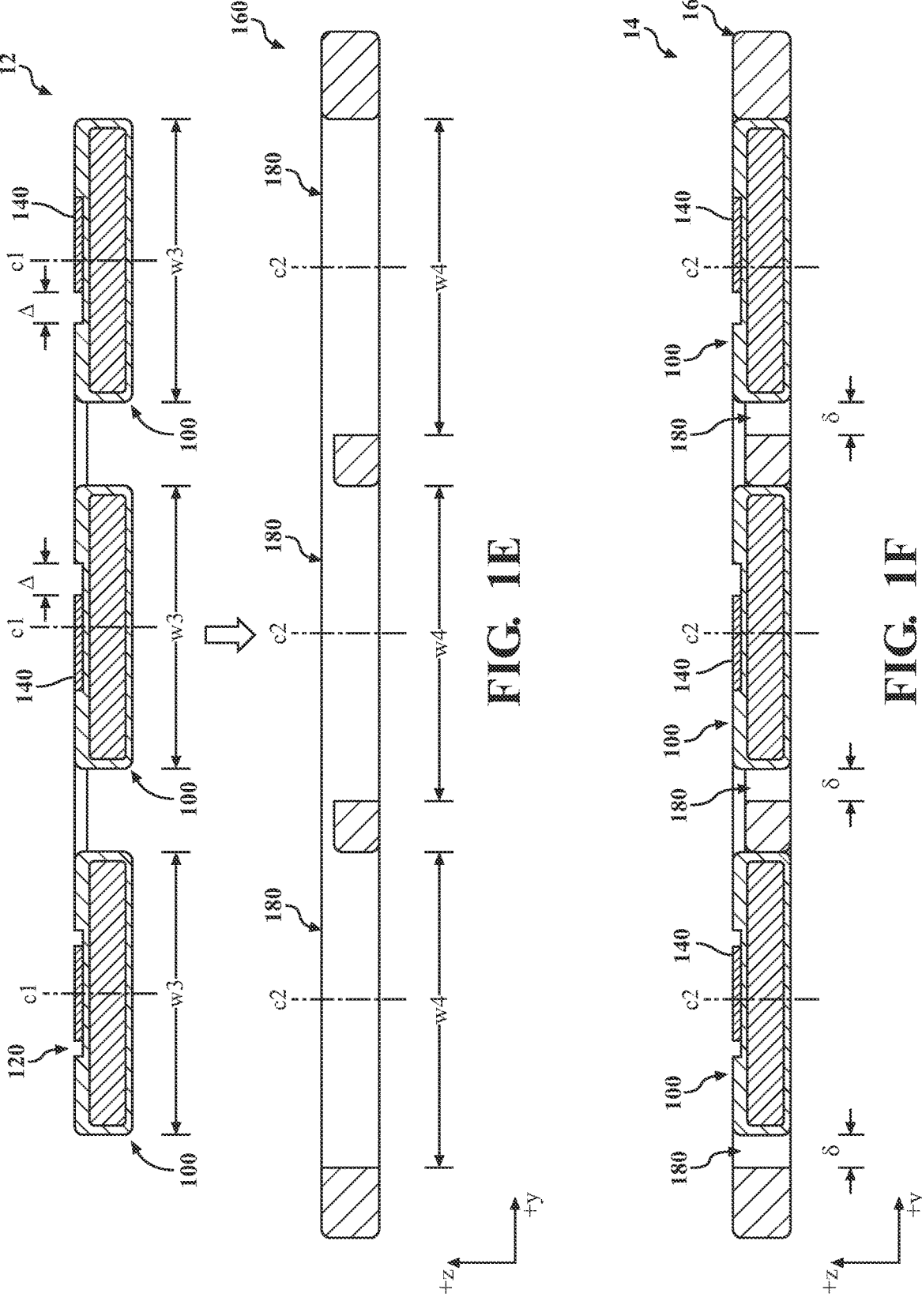
FIG. 1E shows a side cross-sectional view of the power device-substrate assembly array in FIG. 1D and a dielectric substrate.
FIG. 1F shows a power device-substrate assembly array assembled with the dielectric substrate in FIG. 1E.

In addition to the gap or spacing for the assembly of the power device—substrate fabrication layer 12, another gap or spacing for the assembly of a power device fabrication layer 14 is present. For example, and with reference to FIGS. 1E-1F, the power device-substrate fabrication layer 12 is assembled with a dielectric substrate 160 (e.g., an FR4 substrate) by placing the substrate array 10 (FIG. 1A) with the plurality of power devices 140 bonded thereto the within pockets 180 of the dielectric substrate 160. And similar to the power devices pockets 102 and the power devices 140, the substrates 100 have an exterior dimension 'w3' (e.g., a width) and the substrate pockets 180 have an interior dimension 'w4' that is greater than the exterior dimension w3 such that a given substrate 100 fits within given substrate pocket 180. That is, the pockets 180 have a gap or spacing of δ=w4-w3 relative to the substrates 100. And as observed from FIG. 1F, placement of the power device substrates 100 within the substrate pockets 180 can result in a position bias to one side (i.e., the +y or −y direction shown in the figure) relative to a center axis 'c2'. In the example shown in FIG. 1F, the power device substrates 100 have been positioned within the substrate pockets 180 to the far right (+y direction) and thus the distance or spacing between the power device substrates 100 and the left hand side of the substrate pockets 180 is δ. Also, the location of the far right (+y direction) power device 140 in FIG. 1F is δ+Δ/2 from a desirable middle position (center axis 'c2') within the far right substrate pocket 180. And given that a width of a copper signal pad on a surface of a power device 140 can be about 400 micrometers (μm) or less, the summation of the gaps or spacings for the assembly steps can undesirably impact subsequent fabrication processes, such as copper vias positioning, and their desired function.

Figure 2A:
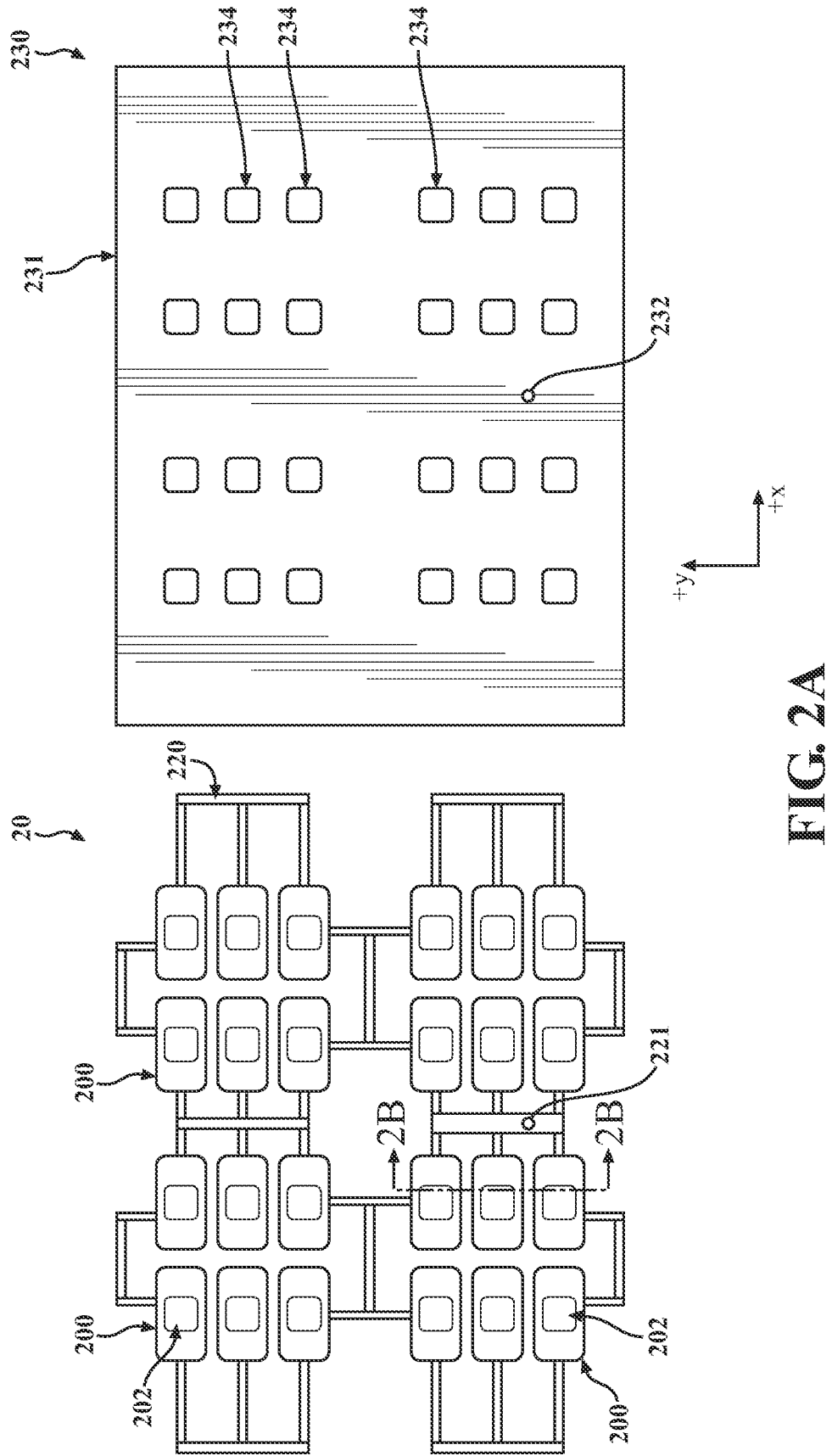
FIG. 2A shows a top view of a substrate array with a lead frame structure and a bonding fixture according to another form of the present disclosure.

Referring now to FIG. 2A-2E, steps for manufacturing a power device fabrication panel according to another form of the present disclosure are shown. Particularly, FIG. 2A shows a top view of a substrate array 20 with an array of substrates 200 and a lead frame 220, and a bonding fixture 230 formed from a panel 231 with an array of power device openings 234. However, and unlike the lead frame 120 discussed above, the lead frame 220 includes a first alignment mark 221 and the bonding fixture 230 includes a second alignment mark 232. The first alignment mark 221 is registered (located) in the lead frame 220 and the second alignment mark 232 is registered in the bonding fixture 230 such that co-linear alignment of the first alignment mark 221 with the second alignment mark 232, and vice-versa, positions the power device openings 234 in "assembly alignment" with a plurality of power device pockets 202 in the substrate array 20.

As used herein, the phrase "assembly alignment" refers to alignment between a first structure and a second structure such that the first structure, or another structure, can be moved in a straight line and positioned within a pocket of the second structure. For example, and with reference to FIGS. 2B-2D, the second alignment mark 232 is vertically (z axis) co-linear with the first alignment mark 221 such that the power device openings 234 are vertically aligned with the power device pockets 202 as shown in FIG. 2C. And such alignment allows for the movement of a plurality of power devices 140 through (−z direction) the plurality of power device openings 234 and positioning and bonding of the plurality of power devices 140 to the seating surfaces 203 at desired locations within the power device pockets 202 (e.g., centered on the axis 'c1' in FIG. 2D) to form a power device-substrate fabrication layer 22. Stated differently, positioning the bonding fixture 230 proximal to the power device substrate array 20 and aligning the second alignment mark 232 with the first alignment mark 221, positions the power device openings 234 in assembly alignment with the power device pockets 202. And such assembly alignment provides for desired positioning of the power devices 140 in the power device pockets 202 via movement (e.g., −z direction) of the power devices 140 at least partially through the power device openings 234 of the bonding fixture 230. For example, alignment of the bonding fixture 230 with the power device substrate array 20 via the second alignment mark 232 and the first alignment mark 221, provides for the power devices 140 to be moved vertically down (−z direction) through the power device openings 234 and positioned generally in the middle of a respective power device pocket 202 (i.e., centered on the axis 'c1') such that the distance or spacing Δ/2 is present between both sides (+y side and −y side) of a given power device 140 and a given power device pocket 202.

In some variations, the first alignment mark 221 and the second alignment mark 232 are line-of-sight alignment marks. And as used herein, the phrase "line-of-sight alignment mark" refers to an alignment mark that provides or allows alignment by visually seeing through the alignment mark. Accordingly, in some variations the first alignment mark 221 and the second alignment mark 232 are apertures extending through the lead frame 220 and bonding fixture 230, respectively. And with such line-of-sight alignment marks, visual alignment and/or visual confirmation of alignment of the first alignment mark 221 with the second alignment mark 232 is provided.

Figures 2E, 2F:
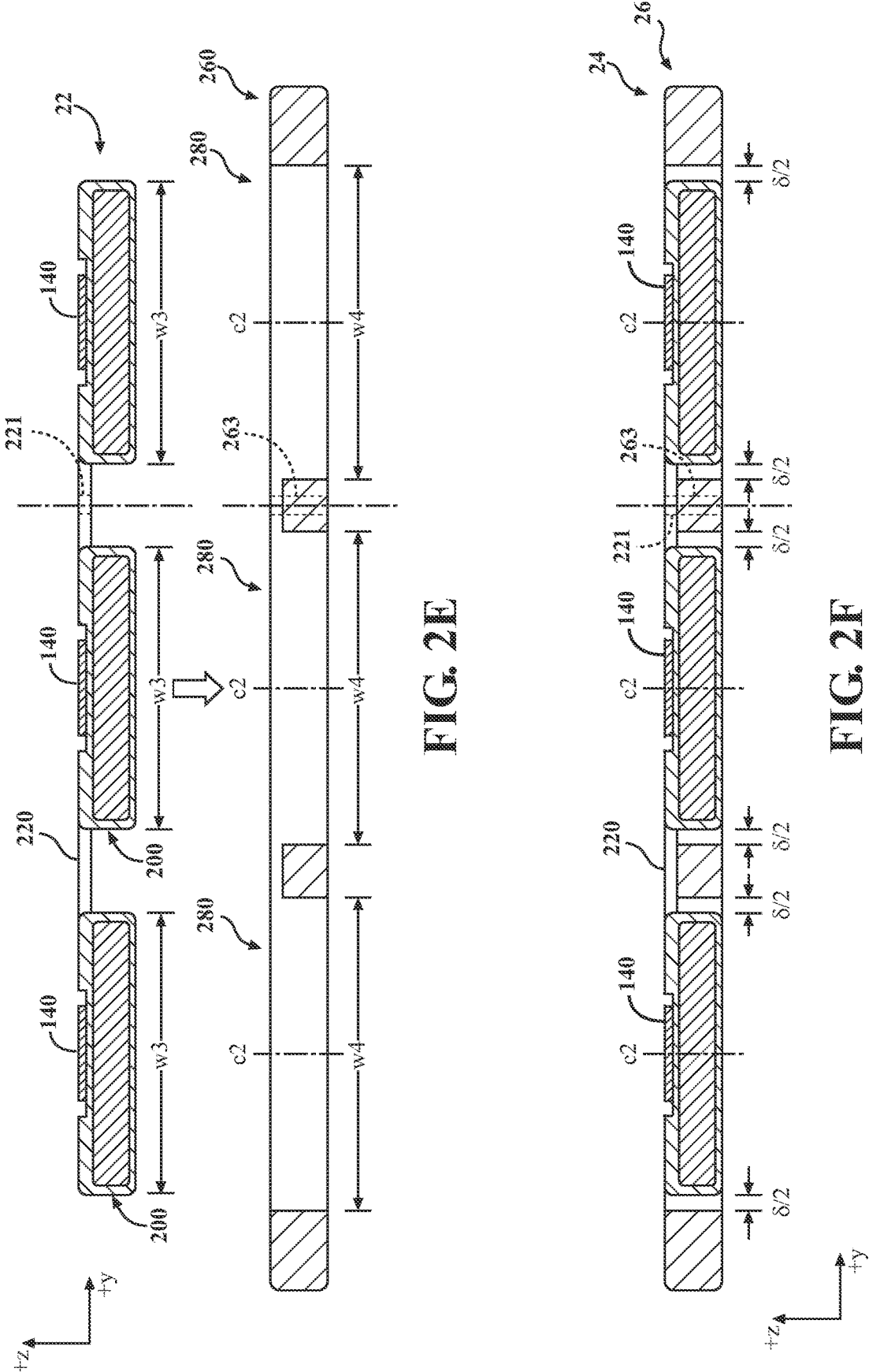
FIG. 2E shows a side cross-sectional view of the power device-substrate assembly array in FIG. 2D and a dielectric substrate according to the teachings of the present disclosure.
FIG. 2F shows the power device-substrate assembly array assembled with the dielectric substrate in FIG. 2E.

And with reference to FIGS. 2E-2F, in some variations assembly of a power device fabrication panel 24 includes a dielectric substrate 260, with a plurality of substrate pockets 280, having a third alignment mark 263. In such variations, alignment of the first alignment mark 221 of the lead frame 220 with the third alignment mark 263 provides for positioning of the power device substrates 200 in a desirable position within the plurality of substrate pockets 280. For example, and as illustrated in FIG. 2F, alignment of the first alignment mark 221 with the third alignment mark 263 allows for the power device substrates 200 to be moved vertically down (−z direction) and positioned generally in the middle of a respective substrate pocket 280 ((i.e., centered on the axis 'c2') such that the distance or spacing δ/2 is present between both sides (+y side and −y side) of a given power device substrate 200 and a given substrate pocket 280.

It should be understood that while FIGS. 2A-2F illustrate alignment using a single alignment mark in the lead frame 220 (i.e., first alignment mark 221) and the bonding fixture 230 (i.e., second alignment mark 232), more than one alignment mark per lead frame 220 and bonding fixture 230 can be used and is included in the teachings of the present disclosure. For example, the lead frame 220 can include two or more first alignments marks spaced apart from each other (not shown) and the bonding fixture 230 can include two or more second alignment marks spaced apart from each other (not shown) such that alignment of the first alignment marks with the second alignment marks arranges or positions the power device openings 234 in assembly alignment with the power device pockets 202 as discussed above. In addition, the dielectric substrate 260 can include two or more third alignment marks spaced apart from each other (not shown) such that alignment of the first alignment marks with the third alignment marks arranges or positions the power device substrates 200 in assembly alignment with the substrate pockets 280 as discussed above.

Figure 3A:
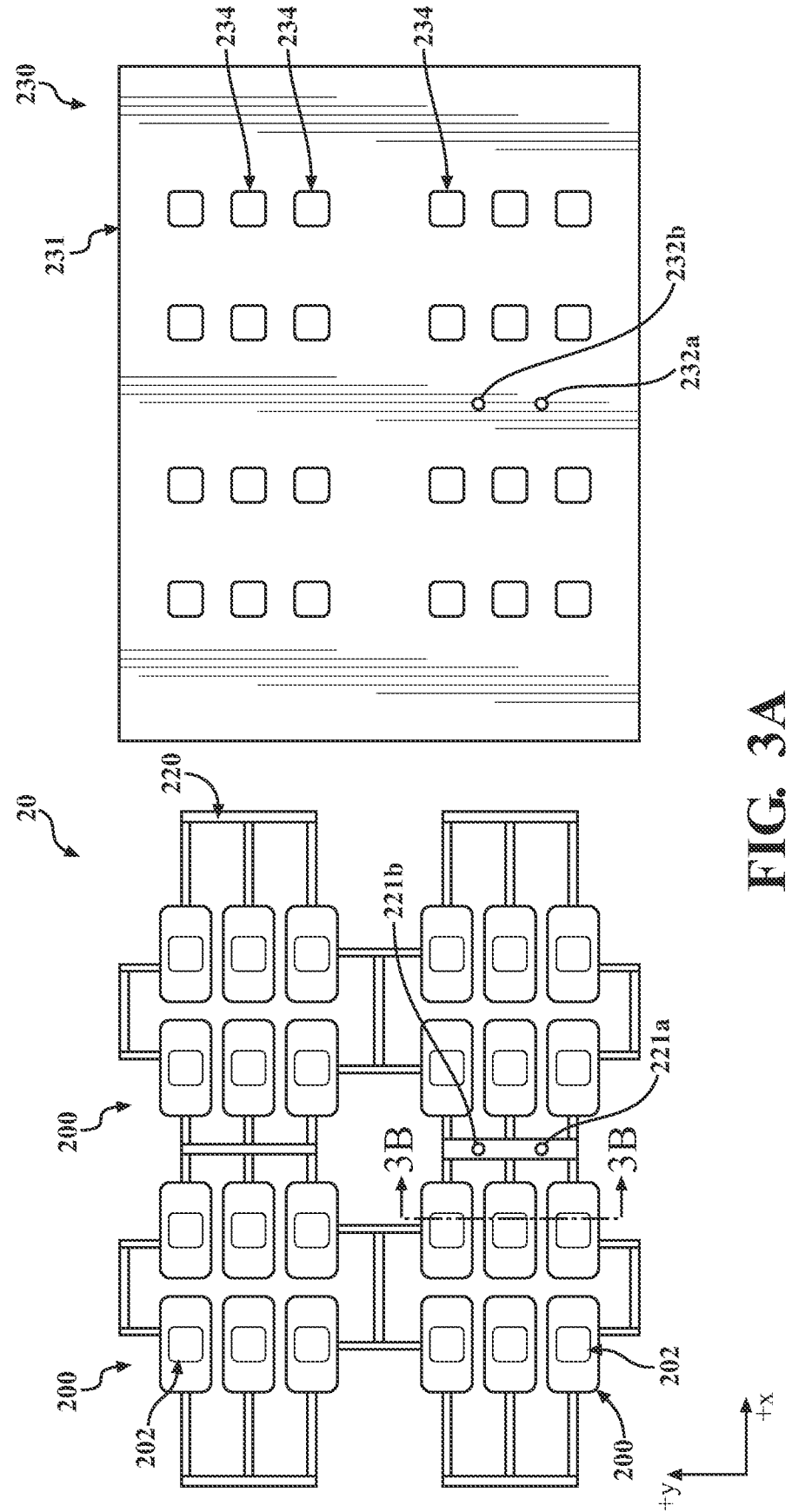
FIG. 3A shows a top view of a substrate array with a lead frame structure and a bonding fixture according to still another form of the present disclosure.
Figures 3B, 3C:
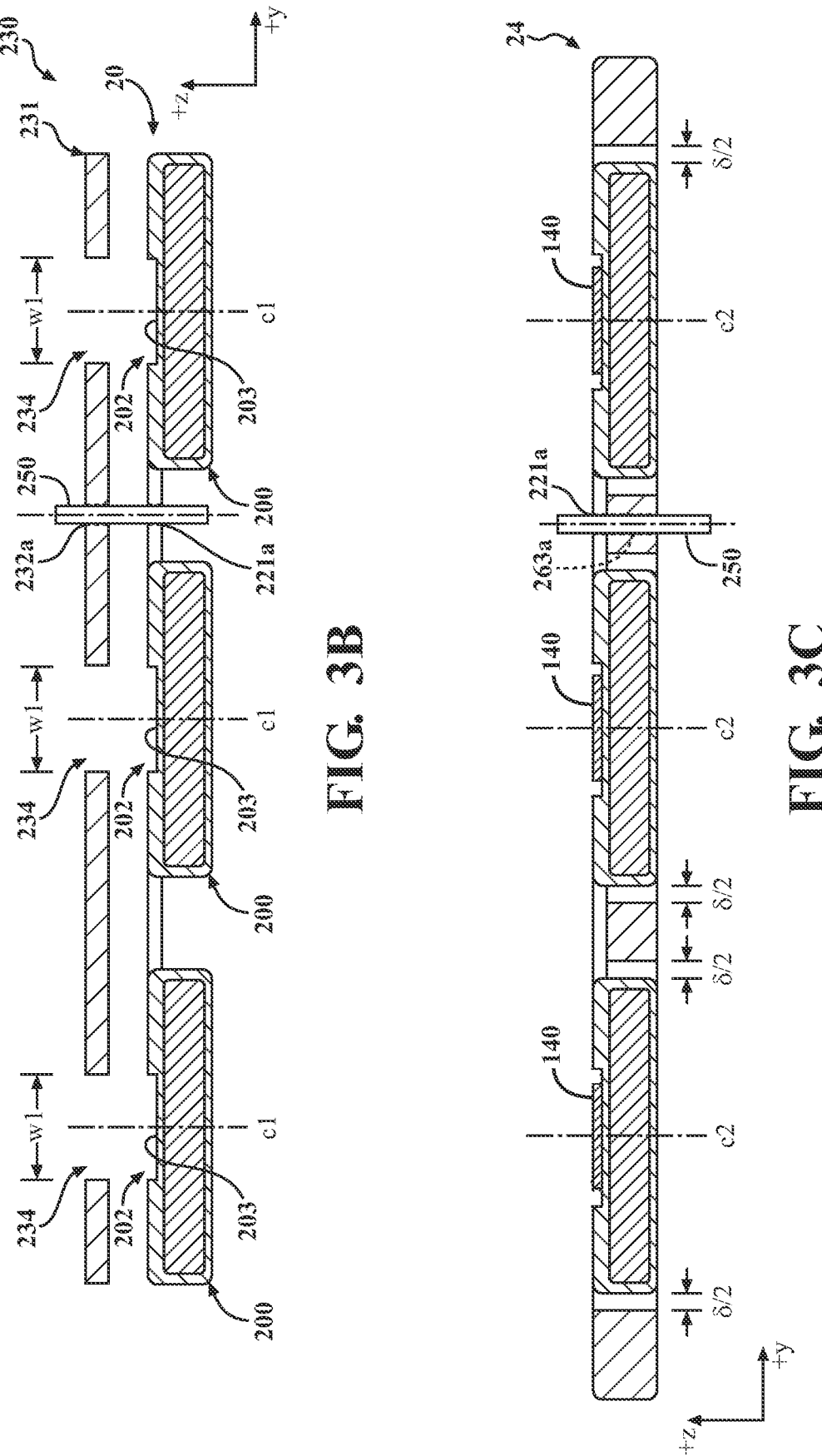
FIG. 3B shows a side-cross-section view of section 3B-3B in FIG. 3A with the bonding fixture aligned with the substrate array via an alignment pin according to the teachings of the present disclosure.
FIG. 3C shows a power device-substrate assembly array formed from a plurality of power devices assembled with the substrate array in FIG. 3B and the power device-substrate assembly array assembled with a dielectric substrate via an alignment pin according to the teachings of the present disclosure.

Referring to FIGS. 3A-3C, steps for manufacturing a power device fabrication panel according to still another form of the present disclosure are shown. Particularly, FIG. 3A shows a top view of the power device substrate array 20 with the array of power device substrates 200 and the lead frame 220. However, and unlike the lead frame 220 discussed above, the lead frame 220 includes a first alignment pin aperture 221a, and optionally another first alignment pin aperture 221b. In addition, the bonding fixture 230 includes a second alignment pin aperture 232a, and optionally another second alignment pin aperture 232b. And with reference to FIG. 3B, alignment of the first alignment pin aperture 221a with the second alignment pin aperture 221b is provided via an alignment pin 250 inserted into and extending through the first alignment pin aperture 221a and the second alignment pin aperture 232a.

Alignment of the first alignment pin aperture 221a with the second alignment pin aperture 232a via the alignment pin 250 arranges or positions the power device openings 234 in assembly alignment with the power device pockets 202 as discussed above. And with reference to FIG. 3C, the dielectric substrate 260 includes a third alignment pin aperture 263a, and optionally another third alignment pin aperture (not shown), and alignment of the first alignment pin aperture 221a with the third alignment pin aperture 263a via the alignment pin 250 (or another alignment pin) arranges or positions the power device substrates 200 in assembly alignment with the substrate pockets 280 as discussed above.

Figure 4A:
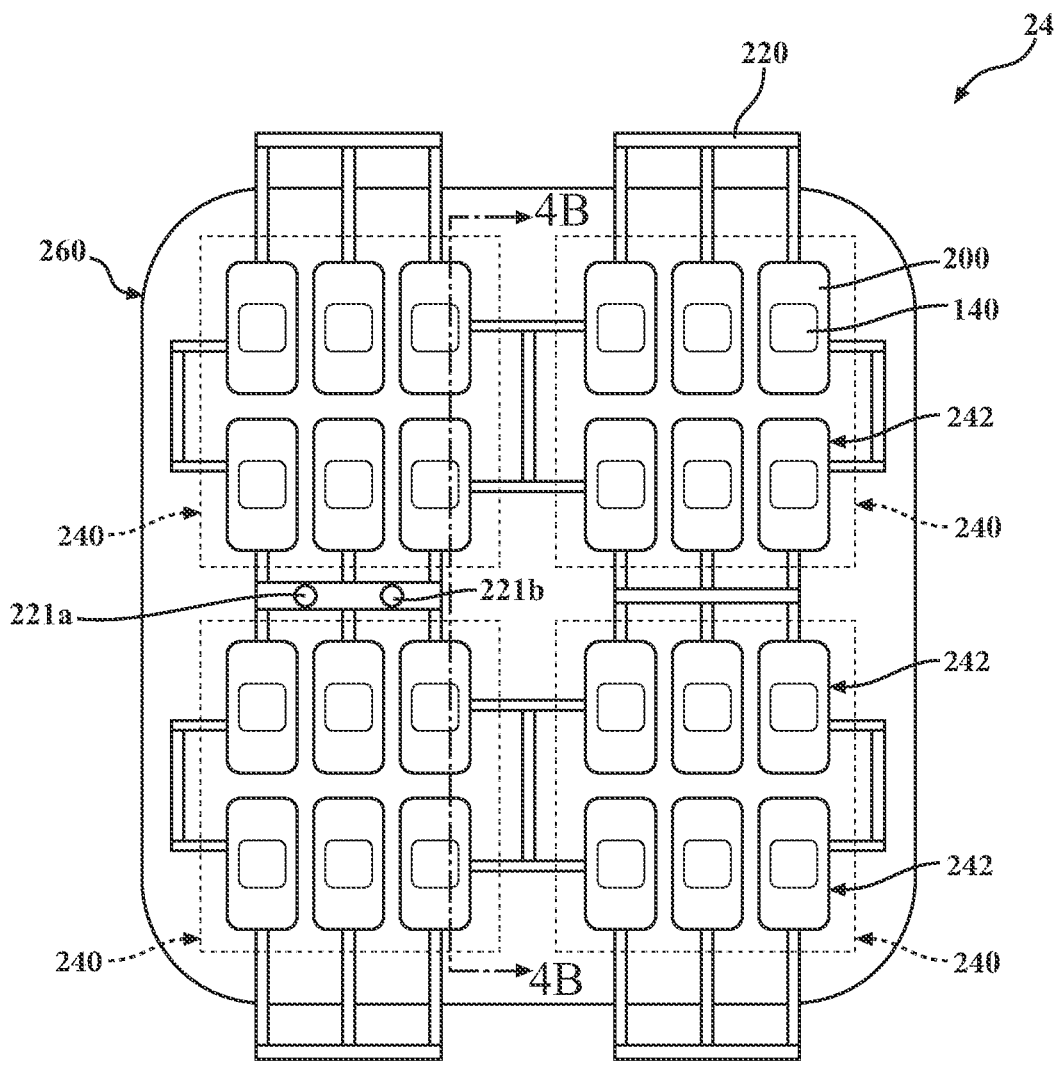
FIG. 4A shows a power device fabrication layer formed according to the teachings of the present disclosure.

Referring now to FIG. 4A-4G, a top view of the power device fabrication panel 24 manufactured according to the teachings of the present disclosure is shown in FIG. 4A and steps for manufacturing a plurality of highly IPEs embedded PCB-cold plate assemblies according to at least one form of the present disclosure are shown in FIGS. 4B-4G. The power device fabrication panel 24 is designed and manufactured to provide four (4) separate power device units 240 as illustrated by the dotted lines in the figure. That is, four individual power device units 240 are provided after the power device fabrication panel 24 is cut or separated into individual power device units. Also, each of the power device units 240 includes one or more power device—substrate assemblies 242 (six power device-substrate assemblies 242 per power device unit 240 shown in FIG. 4A) formed from a power device 140 bonded to a substrate 200. It should be understood that the power device fabrication panel 24 can be manufactured to have less than four or more than four individual power device units 240 after the power device fabrication panel 24 is cut or separated into individual power device units and each power device unit 240 can include less than six or more than six power device-substrate assemblies 242.

Figure 4B:
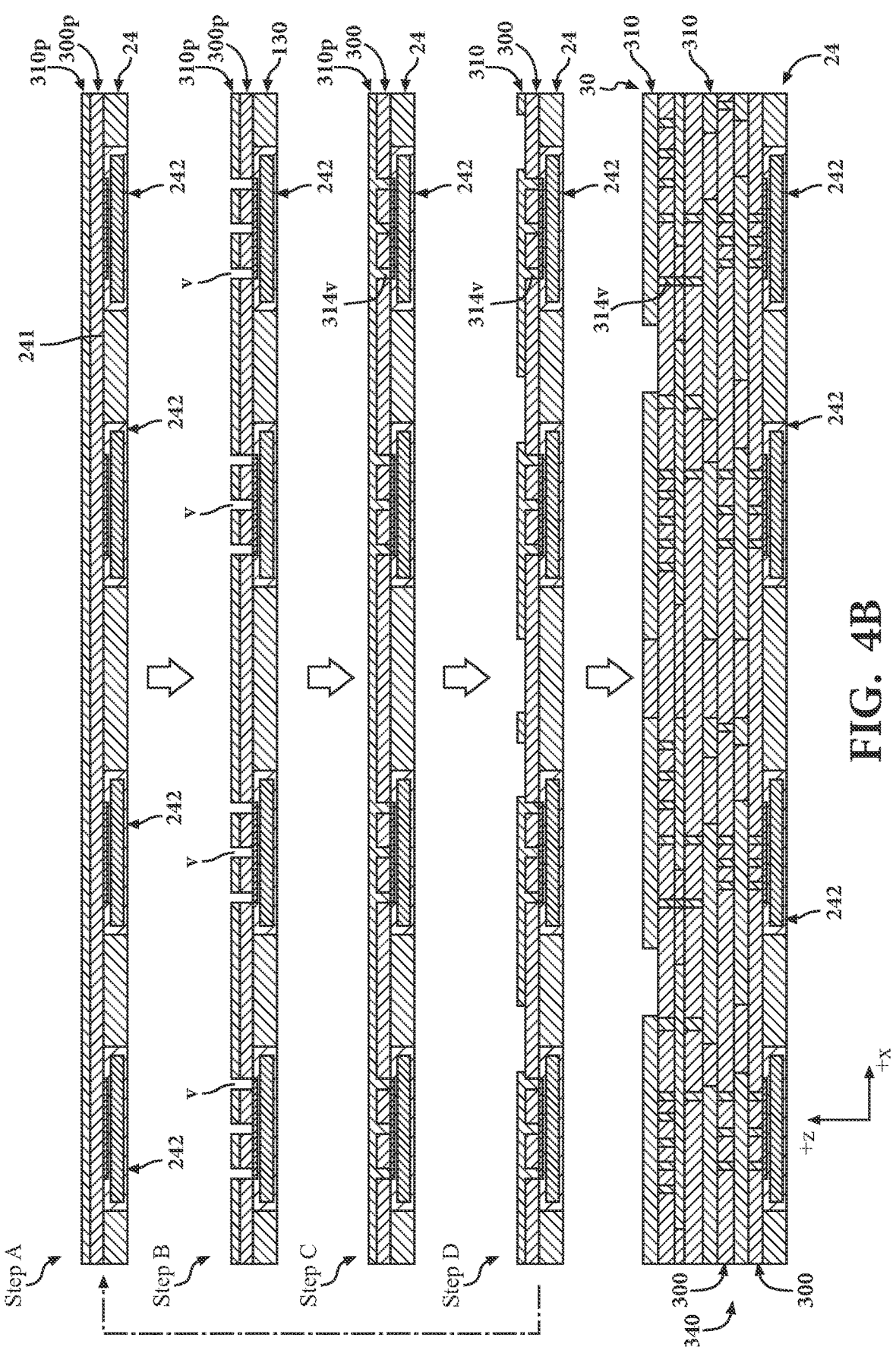
FIG. 4B illustrates bonding of the power device fabrication panel in FIG. 4A to a multi-layer PCB and forming an integrated power electronics (IPEs) embedded PCB fabrication panel according to the teachings of the present disclosure.

FIG. 4B illustrates bonding (e.g., laminating) a multi-layer PCB 30 to the power device fabrication panel 24 and forming an IPEs embedded PCB fabrication panel 340. In some variations, bonding the multi-layer PCB 30 to the power device fabrication panel 24 includes bonding or fabricating the multi-layer PCB 30 on the power device fabrication panel 24 layer(s)-by-layer(s). For example, bonding of the multi-layer PCB 30 to the power device fabrication panel 24 can include bonding a dielectric layer 300p (e.g., an FR4 layer) and a conductive layer 310p to an upper (+z direction) surface 241 of the power device fabrication panel 24 as illustrated at Step A in FIG. 4B, and drilling vias 'v' into and at least partially through the dielectric layer 300p and conductive layer 310p at Step B. In at least one variation, the vias extend through the dielectric layer 300p, the conductive layer 310p, and to the power device-substrate assemblies 242. For example, the vias can extend through the dielectric layer 300p, the conductive layer 310p, and to a power device 140 (FIG. 4A) of the power device-substrate assemblies 242. The vias v are filled with conductive material to form conductive vias 114v at Step C and thereby provide interlayer conductive connection(s), and a portion or portions 'p' of the conductive layer 310p can be removed at Step D to provide a desired or designed conductive pattern to provide a power layer 310. In addition, Steps A-D, and others (not shown), can be repeated until the multi-layer PCB 30 is formed and bonded to the power device fabrication panel 24 and the IPEs embedded PCB fabrication panel 340 is provided. In some variations, the vias are formed or drilled using laser drilling, the vias are filled with conductive material using electroplating (e.g., electroplating of copper into the vias v), and/or the portion(s) of the conductive layer 310p is/are removed by etching (e.g., acid etching).

It should be understood that bonding the multi-layer PCB 30 to the power device fabrication panel 24 and forming the IPEs embedded PCB fabrication panel 340 before bonding the power device fabrication panel 24 to a cold plate fabrication panel 40 (FIG. 4C) provides electrical communication or pathways between adjacent power layers 310 and the power device-substrate assemblies 242 without exposing the cold plate fabrication panel 40 made from a reactive metal such as aluminum to a corrosive electroplating solution. Stated differently, fabricating the IPEs embedded PCB fabrication panel 340 without the presence of the cold plate fabrication panel 40 protects the cold plate fabrication panel 40 from being in contact with and possibly corroded by an electroplating solution and/or electroplating process.

Figures 4C, 4D:
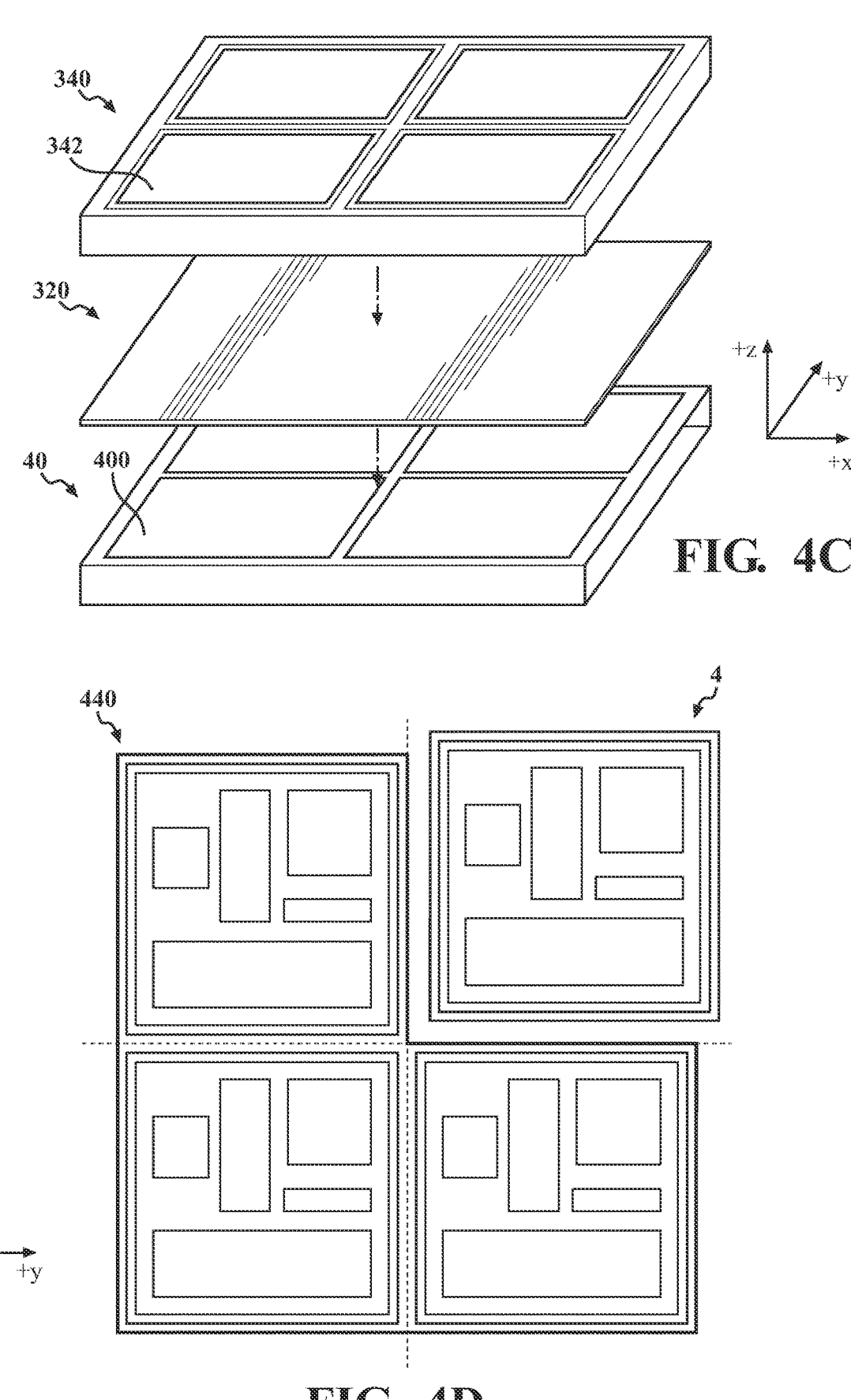
FIG. 4C illustrates the IPEs embedded PCB fabrication panel in FIG. 4B being bonded to a cold plate fabrication panel and forming an IPEs embedded PCB-cold plate fabrication panel according to the teachings of the present disclosure.
FIG. 4D illustrates cutting the IPEs embedded PCB-cold plate fabrication panel into a plurality of highly IPEs embedded PCB-cold plate assemblies according to the teachings of the present disclosure.

FIG. 4C illustrates bonding the IPEs embedded PCB fabrication panel 340 to a cold plate fabrication panel 40 with individual IPEs embedded PCBs 342 aligned (z direction) with individual cold plates 400 such that an IPEs embedded PCB-cold plate fabrication panel 440 is formed (FIG. 4D). The IPEs embedded PCB fabrication panel 340 can be bonded to the cold plate fabrication panel 40 using any bonding technique or process suitable for bonding a multi-layer PCB to a cold plate, including the techniques and processes disclosed herein. In some variations, the IPEs embedded PCB fabrication panel 340 is bonded to the cold plate fabrication panel 40 via a bonding interface 320 that includes a CVD dielectric layer, a LTR dielectric layer, or a ceramic sintered layer.

In some variations, the IPEs embedded PCB fabrication panel 340 is laminated to the cold plate fabrication panel 40 via the bonding interface 320, while in other variations, IPEs embedded PCB fabrication panel 340 is bonded to the cold plate fabrication panel 40 via the bonding interface 320 using heat (i.e., elevated temperature) and/or pressure (i.e., elevated pressure). For example, in some variations pressures between about 2.1 megapascals (MPa) (300 pounds per square inch (psi)) and about 2.8 MPa (400 psi) are applied to the IPEs embedded PCB fabrication panel 340 and the cold plate fabrication panel 40 (with the bonding interface 320 sandwiched therebetween). In the alternative, or in addition to, the IPEs embedded PCB fabrication panel 340 and the cold plate fabrication panel 40, with the bonding interface 320 sandwiched therebetween, are held at temperatures between about 150° C. (300° F.) and about 204° C. (400° F.).

FIG. 4D illustrates the IPEs embedded PCB-cold plate fabrication panel 440 being cut into individual highly IPEs embedded PCB-cold plate assemblies 4. It should be understood that the individual highly IPEs embedded PCB-cold plate assemblies 4 include an individual IPEs embedded PCBs 342 aligned with and bonded to an individual cold plate 400.

Figure 5:
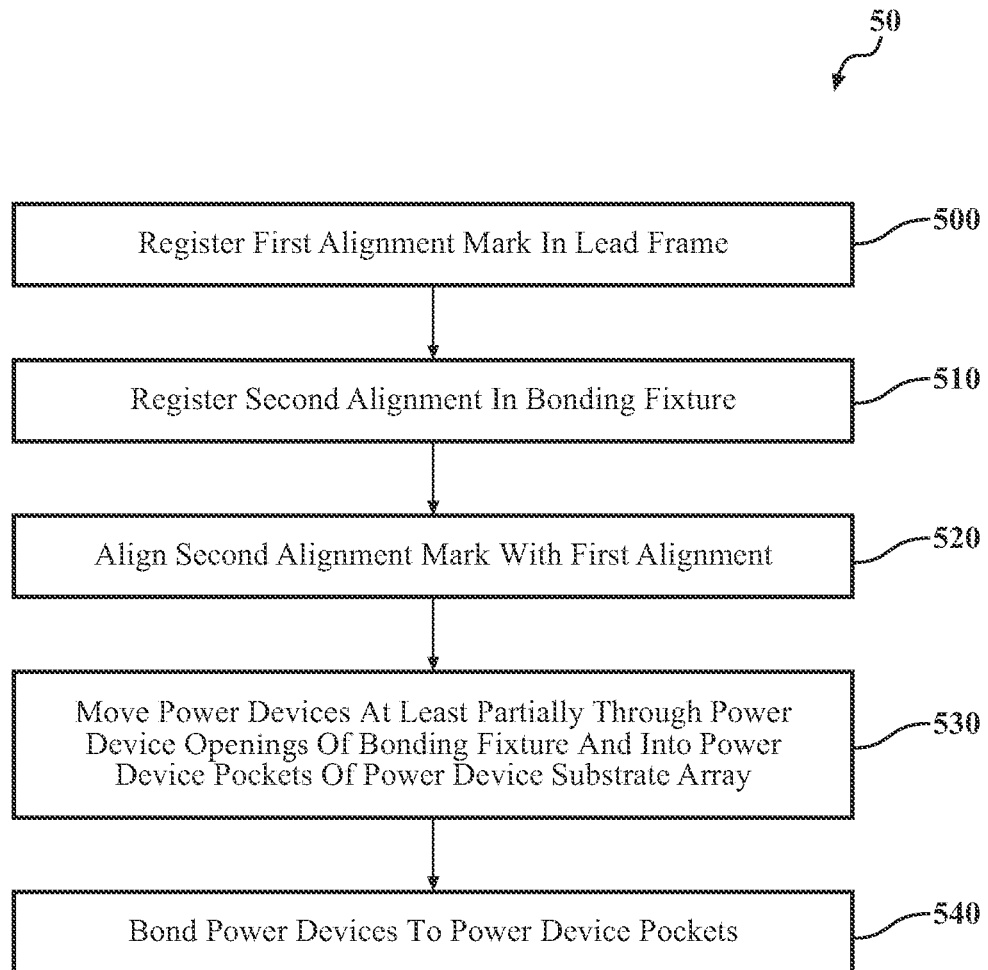
FIG. 5 shows a flow chart for a method manufacturing a power device-substrate assembly array according to the teachings of the present disclosure.

Referring to FIG. 5, a flow chart for a method 50 of manufacturing a power device array according to the teachings of the present disclosure is shown. The method 50 includes registering a first alignment mark in a lead frame of a substrate array at 500 and registering a second alignment mark in a bonding fixture at 510. The second alignment mark is aligned with the first alignment mark at 520 such that a plurality of power device openings in the bonding fixture are in assembly alignment with a plurality of power device pockets in the substrate array. At 530, a plurality of power devices are moved at least partially through the plurality of power device openings in the bonding fixture and into the plurality of power device pockets in the substrate array, and the power devices are bonded to and/or in the power device pockets at 540.

Referring to FIG. 6, a flow chart for a method 60 of manufacturing a power device fabrication layer according to the teachings of the present disclosure is shown. The method 60 includes registering a first alignment mark in a lead frame of a substrate array at 600 and registering a second alignment mark in a bonding fixture at 610. The second alignment mark is aligned with the first alignment mark at 620 such that a plurality of power device openings in the bonding fixture are in assembly alignment with a plurality of power device pockets in the substrate array. At 630, a plurality of power devices are moved at least partially through the plurality of power device openings in the bonding fixture and into the plurality of power device pockets in the substrate array, and the power devices are bonded to or in the power device pockets at 640.

The method 60 further includes registering a third alignment mark in a dielectric substrate at 650 and aligning the first alignment mark with the third alignment mark at 660 such that such that a plurality of substrates of the substrate array are in assembly alignment with a plurality of substrate pockets in the dielectric substrate. At 670 the plurality of substrates are moved into the substrate pockets and the plurality of substrates are bonded to and/or in the substrate pockets at 680.

The preceding description is merely illustrative in nature and is in no way intended to limit the disclosure, its application, or its uses. Work of the presently named inventors, to the extent it may be described in the background section, as well as aspects of the description that may not otherwise qualify as prior art at the time of filing, are neither expressly nor impliedly admitted as prior art against the present technology.

The block diagram in the figures illustrates the architecture, functionality, and operation of possible implementations of systems, methods, and computer program products according to various embodiments. In this regard, each block in the block diagram may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The systems, components, devices, processes, and/or controllers described above can be realized in hardware or a combination of hardware and software and can be realized in a centralized fashion in one processing system or in a distributed fashion where different elements are spread across several interconnected processing systems. Any kind of processing system or another apparatus adapted for conducting the methods described herein is suited. A typical combination of hardware and software can be a processing system with computer-usable program code that, when being loaded and executed, controls the processing system such that it conducts the methods described herein. The systems, components and/or processes also can be embedded in a computer-readable storage, such as a computer program product or other data programs storage device, readable by a machine, tangibly embodying a program of instructions executable by the machine to perform methods and processes described herein. These elements also can be embedded in an application product which comprises all the features enabling the implementation of the methods described herein and, when loaded in a processing system, is able to conduct these methods.

As used herein, the phrase at least one of A, B, and C should be construed to mean a logical (A or B or C), using a non-exclusive logical "or." It should be understood that the various steps within a method may be executed in different order without altering the principles of the present disclosure. Disclosure of ranges includes disclosure of all ranges and subdivided ranges within the entire range.

The headings (such as "Background" and "Summary") and sub-headings used herein are intended only for the general organization of topics within the present disclosure and are not intended to limit the disclosure of the technology or any aspect thereof. The recitation of multiple variations or forms having stated features is not intended to exclude other variations or forms having additional features, or other variations or forms having different combinations of the stated features.

As used herein the term "about" when related to numerical values herein refers to known commercial and/or experimental measurement variations or tolerances for the referenced quantity. In some variations, such known commercial and/or experimental measurement tolerances are +/−10% of the measured value, while in other variations such known commercial and/or experimental measurement tolerances are +/−5% of the measured value, while in still other variations such known commercial and/or experimental measurement tolerances are +/−2.5% of the measured value. And in at least one variation, such known commercial and/or experimental measurement tolerances are +/−1% of the measured value.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The phrase "at least one of . . . and . . . " as used herein refers to and encompasses any and all possible combinations of one or more of the associated listed items. As an example, the phrase "at least one of A, B, and C" includes A only, B only, C only, or any combination thereof (e.g., AB, AC, BC, or ABC).

As used herein, the terms "comprise" and "include" and their variants are intended to be non-limiting, such that recitation of items in succession or a list is not to the exclusion of other like items that may also be useful in the devices and methods of this technology. Similarly, the terms "can" and "may" and their variants are intended to be non-limiting, such that recitation that a form or variation can or may comprise certain elements or features does not exclude other forms or variations of the present technology that do not contain those elements or features.

The broad teachings of the present disclosure can be implemented in a variety of forms. Therefore, while this disclosure includes particular examples, the true scope of the disclosure should not be so limited since other modifications will become apparent to the skilled practitioner upon a study of the specification and the following claims. Reference herein to one variation, or various variations means that a particular feature, structure, or characteristic described in connection with a form or variation or particular system is included in at least one variation or form. The appearances of the phrase "in one variation" (or variations thereof) are not necessarily referring to the same variation or form. It should also be understood that the various method steps discussed herein do not have to be conducted in the same order as depicted, and not each method step is required in each variation or form.

The foregoing description of the forms and variations has been provided for purposes of illustration and description. It is not intended to be exhaustive or to limit the disclosure. Individual elements or features of a particular form or variation are generally not limited to that particular form or variation, but, where applicable, are interchangeable and can be used in a selected form or variation, even if not specifically shown or described. The same may also be varied in many ways. Such variations should not be regarded as a departure from the disclosure, and all such modifications are intended to be included within the scope of the disclosure.

What is claimed is:

1. A method comprising:
aligning a first alignment mark in a lead frame of a power device substrate array comprising a plurality of power device pockets with a second alignment mark in a bonding fixture comprising a plurality of power device openings such that the power device openings are in assembly alignment with the power device pockets; and
assembling a plurality of power devices onto the power device substrate array by moving the plurality of power devices at least partially through the aligned power device openings and into the power device pockets.

2. The method according to claim 1, wherein the first alignment mark is an aperture extending through the lead frame.

3. The method according to claim 2, wherein the second alignment mark is an aperture extending through the bonding fixture.

4. The method according to claim 3 further comprising inserting an alignment pin through the first alignment mark and the second alignment mark.

5. The method according to claim 1 further comprising:
aligning the first alignment mark on the lead frame with a third alignment mark on a dielectric substrate comprising a plurality of substrate pockets such that the power device substrate array is in assembly alignment with the plurality of substrate pockets; and assembling the power device substrate array onto the dielectric substrate by moving the power device substrate array into the substrate pockets.

6. The method according to claim 5, wherein the first alignment mark is an aperture extending through the lead frame.

7. The method according to claim 6, wherein the third alignment mark is an aperture extending through the dielectric substrate.

8. The method according to claim 7 further comprising inserting an alignment pin through the first alignment mark and the third alignment mark.

9. The method according to claim 5, wherein the dielectric substrate is an FR4 substrate.

10. The method according to claim 5 further comprising bonding the power device substrate array into the substrate pockets and forming a power device fabrication layer.

11. The method according to claim 10 further comprising bonding the power device fabrication layer to a multi-layer printed circuit board (PCB) and forming an integrated power electronics (IPEs) embedded PCB fabrication panel.

12. The method according to claim 11 further comprising bonding the IPEs embedded PCB fabrication panel to a cold plate fabrication panel and forming an IPEs embedded PCB-cold plate fabrication panel.

13. The method according to claim 12 further comprising cutting the IPEs embedded PCB-cold plate fabrication panel into a plurality of individual highly IPEs embedded PCB-cold plate assemblies.

14. A method comprising:
registering a first alignment mark in a lead frame of a power device substrate array comprising a plurality of power device substrates with a plurality of power device pockets, the first alignment mark comprising an aperture extending through the lead frame;
registering a second alignment mark on a bonding fixture comprising a plurality of power device openings, the second alignment mark comprising an aperture extending through the bonding fixture;
positioning the bonding fixture proximate to the power device substrate array and aligning the first alignment mark with the second alignment mark such that the plurality of power device openings in the bonding fixture are in assembly alignment with the plurality of power device pockets in the power device substrate array; and
assembling a plurality of power devices onto the power device substrate array by moving the plurality of power devices at least partially through the aligned power device openings and into the power device pockets.

15. The method according to claim 14 further comprising:
aligning the first alignment mark on the lead frame with a third alignment mark on a dielectric substrate comprising a plurality of substrate pockets such that the power device substrate array is in assembly alignment with the substrate pockets, the third alignment mark comprising an aperture through the dielectric substrate; and
assembling the power device substrate array onto the dielectric substrate by moving the power device substrate array into the plurality of substrate pockets.

16. The method according to claim 15 further comprising inserting an alignment pin through at least one of the first alignment mark and the third alignment mark, and the first alignment mark and the third alignment mark.

17. The method according to claim 16 further comprising bonding the power device substrate array into the substrate pockets and forming a power device fabrication layer.

18. The method according to claim 17 further comprising bonding the power device fabrication layer to a multi-layer printed circuit board (PCB) and forming an integrated power electronics (IPEs) embedded PCB fabrication panel, bonding the IPEs embedded PCB fabrication panel to a cold plate fabrication panel and forming an IPEs embedded PCB-cold plate fabrication panel, and cutting the IPEs embedded PCB-cold plate fabrication panel into a plurality of individual highly IPEs embedded PCB-cold plate assemblies.

19. A method comprising:

registering a first alignment mark in a lead frame structure of a power device substrate array comprising a plurality of power device substrates with a plurality of power device pockets, the first alignment mark comprising an aperture extending through the lead frame structure;

registering a second alignment mark on a bonding fixture comprising a plurality of power device openings, the second alignment mark comprising an aperture extending through the bonding fixture;

positioning the bonding fixture proximate to the power device substrate array and aligning the first alignment mark with the second alignment mark such that the plurality of power device openings in the bonding fixture are in assembly alignment with the plurality of power device pockets in the power device substrate array;

assembling a plurality of power devices onto the power device substrate array by moving the plurality of power devices at least partially through the aligned power device openings and into the power device pockets; and bonding the plurality of power devices into the power device pockets and forming a power device fabrication layer.

20. The method according to claim 19 further comprising bonding the power device fabrication layer to a multi-layer printed circuit board (PCB) and forming an integrated power electronics (IPEs) embedded PCB fabrication panel, bonding the IPEs embedded PCB fabrication panel to a cold plate fabrication panel and forming an IPEs embedded PCB-cold plate fabrication panel, and cutting the IPEs embedded PCB-cold plate fabrication panel into a plurality of individual IPEs embedded PCB-cold plate assemblies.

* * * * *